(12) United States Patent　　(10) Patent No.: US 11,651,910 B2
Parrish et al.　　(45) Date of Patent: May 16, 2023

(54) INDUCTANCE CONTROL SYSTEM

(71) Applicant: Teradyne, Inc., North Reading, MA (US)

(72) Inventors: Frank Parrish, North Reading, MA (US); Diwakar Saxena, North Reading, MA (US); Michael Herzog, North Reading, MA (US); Edward Patrick Dague, North Reading, MA (US)

(73) Assignee: TERADYNE, INC., North Reading, MA (US)

( * ) Notice: Subject to any disclaimer, the term of this patent is extended or adjusted under 35 U.S.C. 154(b) by 237 days.

(21) Appl. No.: 17/117,551

(22) Filed: Dec. 10, 2020

(65) Prior Publication Data

US 2022/0189712 A1　Jun. 16, 2022

(51) Int. Cl.
　　*G01R 31/26*　　(2020.01)
　　*G01R 31/28*　　(2006.01)
　　*H01H 9/00*　　(2006.01)
　　*H01H 9/22*　　(2006.01)
　　*H01H 1/58*　　(2006.01)

(52) U.S. Cl.
　　CPC ....... *H01H 9/0066* (2013.01); *G01R 31/2834* (2013.01); *H01H 1/58* (2013.01)

(58) Field of Classification Search
　　CPC ........ G01R 31/02; G01R 31/26; G01R 31/28; G01R 15/20; H01H 9/00; H01H 9/22; H01H 1/58
　　See application file for complete search history.

(56) References Cited

U.S. PATENT DOCUMENTS

| | | |
|---|---|---|
| 4,144,483 A | 3/1979 | Thornley |
| 4,671,086 A | 6/1987 | Fogleman et al. |
| 4,686,912 A | 8/1987 | Fogleman et al. |
| 4,829,236 A | 5/1989 | Brenardi et al. |
| 5,191,507 A | 3/1993 | Saito |
| 5,364,404 A | 11/1994 | Jaffe et al. |

(Continued)

FOREIGN PATENT DOCUMENTS

| | | |
|---|---|---|
| KR | 10-1816445 B1 | 1/2018 |
| KR | 10-1916296 B1 | 11/2018 |
| KR | 10-1925163 B1 | 12/2018 |

OTHER PUBLICATIONS

International Search Report for International Patent Application No. PCT/US2021/062037, dated Mar. 29, 2022, (3 pages).

(Continued)

*Primary Examiner* — Neel D Shah
(74) *Attorney, Agent, or Firm* — Burns & Levinson LLP (57) ABSTRACT

An example polarity inverter includes multiple contactors, each of which includes switches that are controllable to configure a current path. Each of the multiple contactors includes contacts, which are interleaved such that first contacts to receive voltage having a first polarity alternate with second contacts to receive voltage having a second polarity, where the first polarity and the second polarity are different. The polarity inverter also includes a first conductive plate to connect electrically to each of the first contacts, and a second conductive plate to connect electrically to each of the second contacts. The first conductive plate and the second conductive plate are in parallel. A dielectric material is between the first conductive plate and the second conductive plate.

20 Claims, 6 Drawing Sheets

(56) References Cited

U.S. PATENT DOCUMENTS

| | | | |
|---|---|---|---|
| 5,666,397 A | 9/1997 | Lamons et al. |
| 5,815,388 A | 9/1998 | Manley et al. |
| 6,215,320 B1 | 4/2001 | Parrish |
| 6,429,550 B1 | 8/2002 | Braun et al. |
| 6,515,499 B1 | 2/2003 | Parrish et al. |
| 6,686,732 B2 | 2/2004 | Parrish |
| 6,916,990 B2 | 7/2005 | Behziz et al. |
| 6,939,175 B2 | 9/2005 | Parrish et al. |
| 7,110,239 B2 | 9/2006 | Berkey |
| 7,130,179 B2 | 10/2006 | Guiraud et al. |
| 7,180,321 B2 | 2/2007 | Behziz et al. |
| 7,504,822 B2 | 3/2009 | Parrish et al. |
| 7,541,819 B2 | 6/2009 | Parrish et al. |
| 7,701,232 B2 | 4/2010 | Parrish |
| 7,815,466 B2 | 10/2010 | Yaghmai et al. |
| 7,820,614 B2 | 10/2010 | Tee, Jr. et al. |
| 7,977,583 B2 | 7/2011 | Yaghmai et al. |
| 8,622,752 B2 | 1/2014 | Parrish et al. |
| 8,922,964 B2 | 12/2014 | Chuang et al. |
| 9,435,855 B2 | 9/2016 | Lewinnek et al. |
| 9,601,257 B2 | 3/2017 | Burke et al. |
| 9,786,977 B2 | 10/2017 | Lyons et al. |
| 10,451,652 B2 | 10/2019 | Sinsheimer et al. |
| 10,677,815 B2 | 6/2020 | Mirkhani et al. |
| 2003/0117129 A1 | 6/2003 | Parrish |
| 2003/0122538 A1 | 7/2003 | Parrish et al. |
| 2004/0060725 A1 | 4/2004 | Behziz et al. |
| 2006/0071680 A1 | 4/2006 | Behziz et al. |
| 2007/0066509 A1 | 3/2007 | Tee, Jr. et al. |
| 2007/0096755 A1 | 5/2007 | Parrish et al. |
| 2007/0096756 A1 | 5/2007 | Parrish et al. |
| 2008/0174330 A1 | 7/2008 | Parrish |
| 2009/0023345 A1* | 1/2009 | Matsumoto ......... H01R 25/162 439/720 |
| 2009/0151993 A1 | 6/2009 | Yaghmai et al. |
| 2009/0176406 A1 | 7/2009 | Yaghmai et al. |
| 2009/0258538 A1 | 10/2009 | Yaghmai et al. |
| 2012/0264320 A1 | 10/2012 | Parrish et al. |
| 2013/0118002 A1 | 5/2013 | Burke et al. |
| 2015/0073008 A1 | 3/2015 | Hardas et al. |
| 2017/0170537 A1 | 6/2017 | Lyons et al. |
| 2019/0377007 A1 | 12/2019 | Mirkhani et al. |
| 2020/0204083 A1* | 6/2020 | Hotta ..................... H02M 7/48 |
| 2020/0313373 A1 | 10/2020 | Lee |

OTHER PUBLICATIONS

Written Opinion for International Patent Application No. PCT/US2021/062037, dated Mar. 29, 2022, (4 pages).

* cited by examiner

INDUCTANCE CONTROL SYSTEM

TECHNICAL FIELD

This specification describes examples techniques for controlling inductance in an electronic component, such as a polarity inverter.

BACKGROUND

An example polarity inverter includes circuitry to change the polarity of an electrical signal, such as voltage or current. Polarity, in general, represents electrical potential in a circuit. According to convention, current flows from a positive-polarity terminal to a negative-polarity terminal. Physically, however, electrons flow from the negative-polarity terminal to the positive-polarity terminal. The positive-polarity terminal has greater electrical potential than the negative-polarity terminal. Accordingly, polarity can be understood in terms of both current and voltage.

Inductance includes the tendency of an electrical conductor to oppose a change in current flowing therethrough. Inductance therefore can affect operation of devices, such as a polarity inverter, that implement changes in current.

SUMMARY

An example polarity inverter includes multiple contactors. Each of the multiple contactors includes switches that are controllable to configure a current path. Each of the multiple contactors also includes contacts, which are interleaved such that first contacts to receive voltage having a first polarity alternate with second contacts to receive voltage having a second polarity, where the first polarity and the second polarity are different. The polarity inverter also includes a first conductive plate to connect electrically to each of the first contacts, and a second conductive plate to connect electrically to each of the second contacts. The first conductive plate and the second conductive plate are in parallel. A dielectric material is between the first conductive plate and the second conductive plate. The polarity inverter may include one or more of the following features, either alone or in combination.

A number of the contactors may correspond to an amount of current to pass through the polarity inverter and may be a based on specifications for a type of contactor used. The contacts may include input contacts. Each of the multiple contactors may include output contacts on different sides of the switches than the input contacts. The output contacts may be interleaved such that third contacts on a current path with the first contacts alternate with fourth contacts on a current path with the second contacts. The polarity inverter may also include a first bus bar to connect electrically to each of the third contacts, a second bus bar to connect electrically to each of the fourth contacts, where the first bus bar and the second bus bar are in parallel, and a dielectric material between the first bus bar and the second bus bar.

The switches may be controllable to configure current to flow in a first direction or in a second direction through the multiple contactors. The first direction may be opposite to the second direction. Each of the first conductive plate and the second conductive plate may include conductive fingers to connect to respective ones of the contacts. The multiple contactors may include at least two input contactors and at least two output contactors. The at least two input contactors may be configured to receive current from a current source and the at least two output contactors may be configured to output current on a path to a device interface board. The dielectric may be or include a polyimide film. The dielectric may be or include polypropylene.

Spacing between the first plate and the second plate and interleaving of the contacts may enable the polarity inverter to have an inductance that is less than 200 nanohenries (nH). Spacing between the first plate and the second plate and interleaving of the contacts may enable the polarity inverter to have an inductance that is 100 nanohenries (nH) or less.

A thickness of the dielectric material between the first plate and the second plate may be on the order of tenths of a millimeter. A thickness of the dielectric material between the first plate and the second plate may be 0.5 millimeters (mm) or less. A thickness of the dielectric material between the first bus bar and the second bus bar may be on the order of tenths of a millimeter. A thickness of the dielectric material between the first bus bar and the second bus bar may be 0.5 millimeters (mm) or less.

The contactors may include input contactors and output contactors. The input contactors may include the first conductive plate and the second conductive plate connected, respectively, to a first voltage or current and to a second voltage or current. The polarity inverter may include output contactors having contacts that are interleaved such that third contacts that receive voltage or current having the first polarity alternate with fourth contacts that receive voltage or current having the second polarity. The polarity inverter may also include a third conductive plate to connect electrically to each of the third contacts, and a fourth conductive plate to connect electrically to each of the fourth contacts, where the third conductive plate and the fourth conductive plate are in parallel. The first polarity may be a positive voltage with respect to the second polarity. The first polarity may be a force-high voltage and the second polarity may be a force-low voltage, where the force-high voltage is greater than the force-low voltage.

An example test system includes a device interface board (DIB) to connect to devices under test (DUTs), an interposer to connect to the DIB, a current source, and a polarity inverter to receive current from the current source and to control a directional flow of the current relative to the interposer. The polarity inverter includes multiple contactors, each of which includes switches that are controllable to configure a current path. Each of the multiple contactors includes contacts, which are interleaved such that first contacts to receive voltage having a first polarity alternate with second contacts to receive voltage having a second polarity, where the first polarity and the second polarity are different. The polarity inverter also includes a first conductive plate to connect electrically to each of the first contacts, and a second conductive plate to connect electrically to each of the second contacts. The first conductive plate and the second conductive plate are in parallel. A dielectric material is between the first conductive plate and the second conductive plate. The example test system may include one or more of the following features, either alone or in combination.

The switches may be controllable to configure current to flow in a first direction or a second direction through the multiple contactors. The first direction may be reverse to the second direction. The polarity inverter may include at least two input contactors and at least two output contactors. The at least two input contactors may be configured to receive the current from the current source and the at least two output contactors may be configured to output the current to the interposer.

Any two or more of the features described in this specification, including in this summary section, may be combined to form implementations not specifically described in this specification.

At least part of the devices and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices and techniques described in this specification may be configured or controlled using a computing system comprised of one or more processing devices and memory storing instructions that are executable by the one or more processing devices to perform various control operations including high-current testing. The devices, systems, and/or components described herein may be configured, for example through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are examples of techniques for reducing inductance in electronic devices, such as a polarity inverter. In an example, a polarity inverter is configured to reduce or to minimize the inductance around the polarity inverter, thereby reducing the total inductance of at least part of a signal delivery path between a source of current and destination of the current, such as device under test (DUT). In an example, the polarity inverter includes multiple contactors, each of which includes switches that are controllable to configure a current path. Each of the contactors includes contacts that are interleaved such that first contacts to receive voltage having a first polarity alternate with second contacts to receive voltage having a second polarity that is different from the first polarity. A first conductive plate is configured to connect electrically to each of the first contacts, and a second conductive plate is configured to connect electrically to each of the second contacts. The first conductive plate and the second conductive plate are physically arranged to be in parallel, and a dielectric material is between the first conductive plate and the second conductive plate. The current path is therefore defined, in part, by the conductive plates and switches.

By using parallel plates of the type described herein, particularly plates that are close together, the overall inductance of the polarity inverter can be reduced. For example, the overall inductance of the polarity inverter can be minimized or reduced relative to prior polarity inverters having different configurations. In addition, alternating the first and second contacts may cancel and, therefore, at least partly reduce the overall inductance. Furthermore, as described below, parallel bus bars separated by dielectric may also be part of the current path. In an example, there may be one set of parallel bus bars on each side of the polarity inverter. By using bus bars of this type, particularly bus bars that are close together, the overall inductance of the polarity inverter can be further reduced. In an example, the inductance measured on a high-current (e.g., 2000 Amperes (A)), low-inductance polarity inverter of the type described herein is about 100 nanoHenries (nH) compared to about 480 nH in an example prior polarity inverter. That being said, the polarity inverters described herein are not limited to these, or to any, specific inductance values, current values, and/or voltage values.

Figure 1:
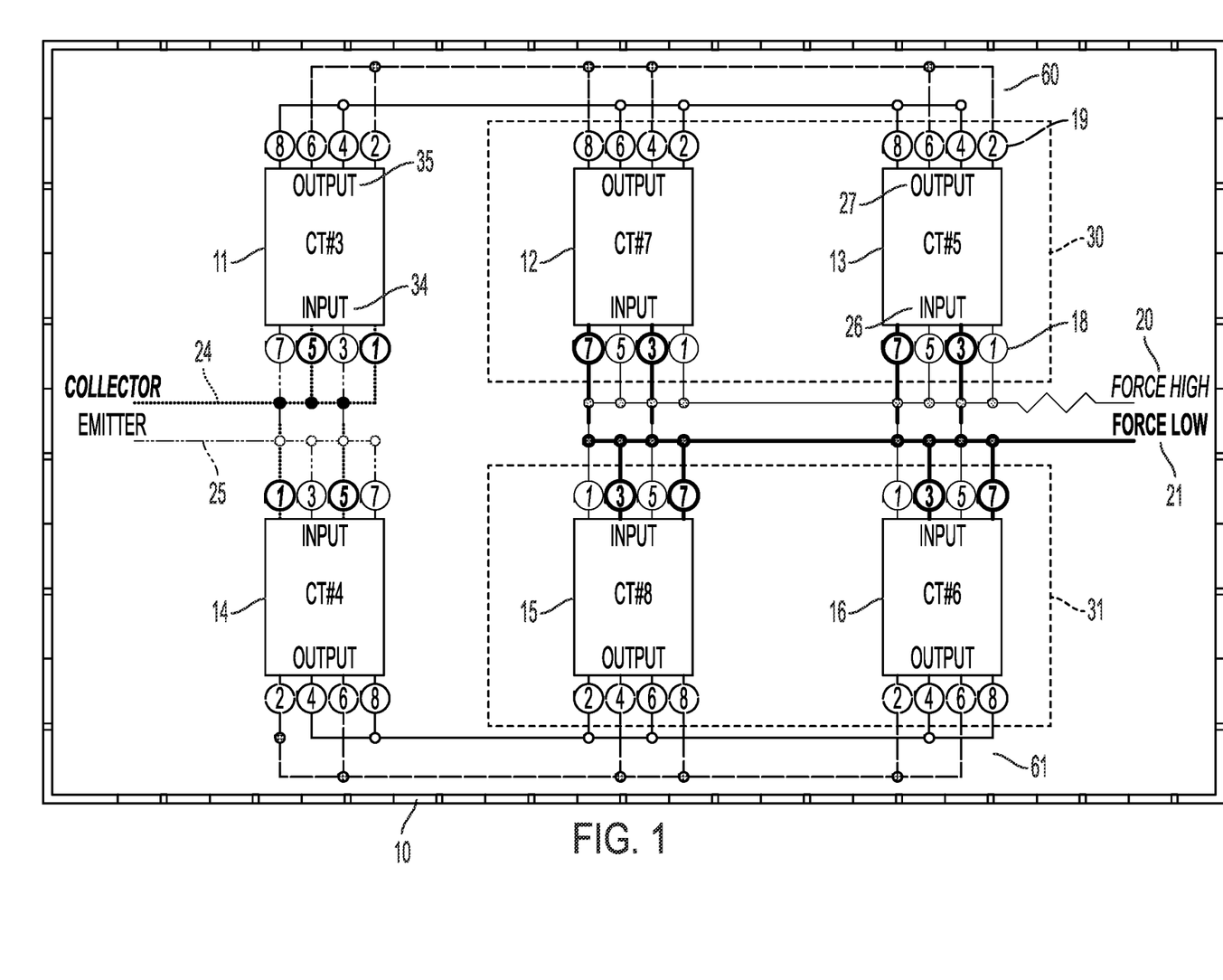
FIG. 1 is a block diagram of components of an example polarity inverter.

FIG. 1 shows a block diagram of components included in an example polarity inverter 10. In this example, polarity inverter 10 includes six contactors 11 to 16. An example contactor is an electronic device that includes switches and other circuitry to route current from its input contacts to its output contacts. Referring to contactor 13, which is representative of the other contactors, each contactor includes four input contacts labeled collectively as 18 and four output contacts labeled collectively as 19. However, the techniques described herein are not limited to contactors having this configuration. Switches (not shown) reside within each contactor to control the current paths between the input contacts and the output contacts. The switches may be controlled electronically or manually. For example a computing system or controller (see FIG. 6, for example) may control individual switches to open or to close to configure or to create desired current path(s) through the polarity inverter.

Figure 6:
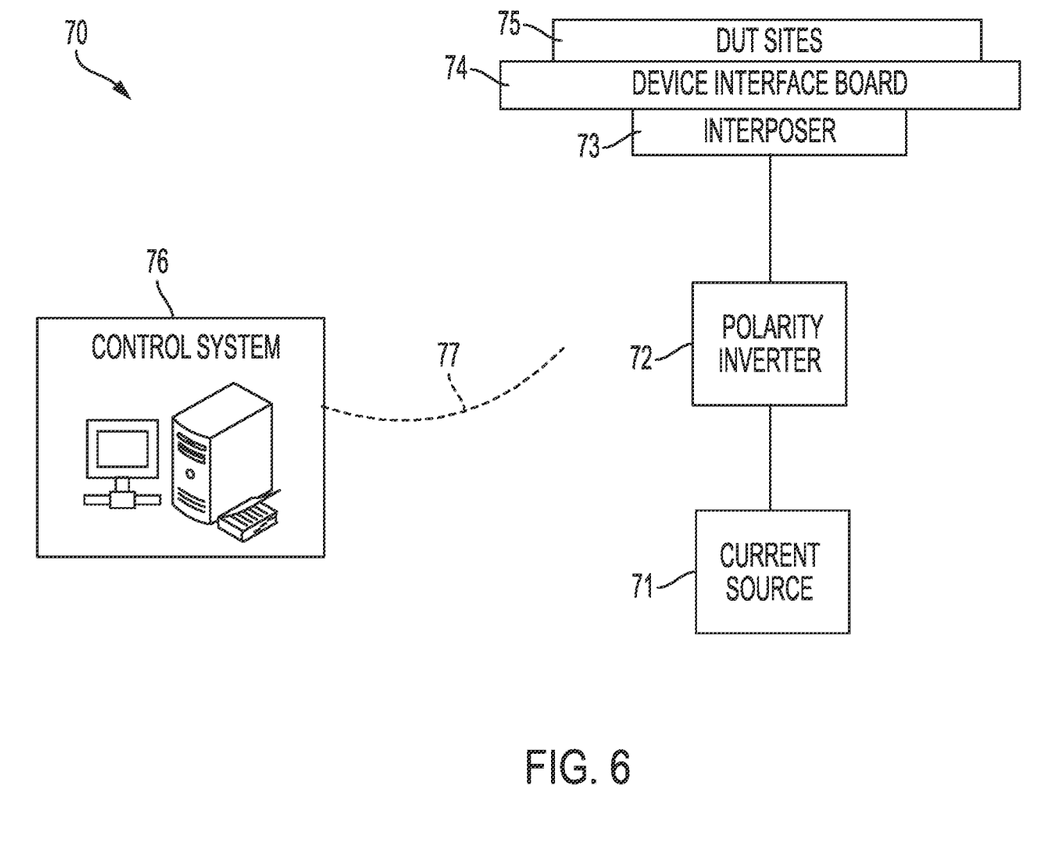
FIG. 6 is a block diagram of an example system that includes the example polarity inverter.

In an example operation, a current source is connected in series with polarity inverter 10, as shown in FIG. 6. In this example, the current source is a high-current source. Examples of high current include, but are not limited to, currents over 500 A, over 1000 A, over 2000 A, over 3000 A, and so forth. In some implementations, the current is pulsed at least part of the time or all of the time. In some example, a pulsed current includes a rapid, transient change in amplitude from a baseline value such as "0" to a higher or lower value, followed by a rapid return to the baseline value. In some implementations, the current is periodic, for example, sinusoidal. In some implementations, the current is steady-state at least part of the time. The current source is connected in series with the input terminals of the polarity inverter to provide a positive polarity, e.g., force-high voltage/current (or simply, "force-high), at input terminal 20 and to provide a negative polarity, e.g., force-low voltage/current (or simply, "force-low"), at input terminal 21. A device, such as a device interface board (DIB) of a test system (see FIG. 6) is connected in series with the output terminals of the polarity inverter to selectively provide a positive polarity, e.g., force-high voltage/current, or a negative polarity, e.g., force-low voltage/current, at output terminals 24 and 25. In this example, output terminals 24 and 25 are labeled "collector" and "emitter" to represent the input voltage and output voltage terminals of a bipolar junction transistor (BJT); however, more generally, terminals 24 and 25 may be any terminals configured to provide different-polarity electrical signals to a connected device or system. In some examples, voltages within a range of 35 Volts (V) to 85V may be used; however, the systems described herein are not limited to any voltage range.

In this example, contactors 12, 13, 15, and 16 are configured as inputs and contactors 11 and 14 are configured as outputs or loads. For example, input voltage and current is applied to input contactors 12, 13, 15, and 16 and that voltage and current is output to output contactors 11 and 14 and, from there, to terminals 24 and 25 as shown in FIG. 1. The contacts on each of the contactors are interleaved such that a first set of contacts that receive voltage and current having a first polarity, such as force-high or positive, alternate with a second set of contacts that receive voltage and current having a second polarity, such as force-low or negative. Alternating the contacts in this manner on each of the contactors alternates the current paths through the contactors and may reduce inductance, as described herein.

By way of example, for contactor 13, contacts ① and are connected to force-high and contacts ③ and ⑦ are connected to force-low. Also, contacts ② and ⑥ are connectable along a same current path as contacts ① and ⑤, whereas contacts ④ and ⑧ are connectable along a same current path as contacts ③ and ⑦. Contacts ①, ③, ⑤, and ⑦ are interleaved in the sense that no two adjacent contacts are connected to a same polarity voltage and current. The same is true for contacts ②, ④, ⑥, and ⑧. Stated another way, the contacts are interleaved in the sense that they alternate in polarity. In an example, on the input side 26 of contactor 13, contact ① is connected to force-high, contact ③ is connected to force-low, contact ⑤ is connected to force-high, and contact ⑦ is connected to force-low. In an example, on the output side 27 of contactor 13, contact ② is connectable to force-high, contact ④ is connectable to force-low, contact ⑥ is connectable to force-high, and contact ⑧ is connectable to force-low. Each of input contactors 12, 15, and 16 has the same contact configuration of input and output contacts as input contactor 13, which is shown in FIG. 1.

By way of example, for output contactor 11, contacts ① and ⑤ are connected to terminal 24 and contacts ③ and ⑦ are connected to terminal 25. Also, contacts ② and ⑥ are connectable along a same current path as contacts ① and ⑤, whereas contacts ④ and ⑧ are connectable along a same current path as contacts ③ and ⑦. Contacts ①, ③, ⑤, and ⑦ are interleaved in the sense that no two adjacent contacts are connected to a same polarity voltage and current. The same is true for contacts ②, ④, ⑥, and ⑧. Stated another way, the contacts are interleaved in the sense that they alternate in polarity. In an example, on the input side 34 of contactor 11, contact ① is connected to terminal 24, contact ③ is connected to terminal 25, contact ⑤ is connected to terminal 24, and contact ⑦ is connected to terminal 25. In an example, on the output side 27 of contactor 11, contact ② is connectable to force-high, contact ④ is connectable to force-low, contact ⑥ is connectable to force-high, and contact ⑧ is connectable to force-low. Contactor 14 has the same contact configuration of input and output contacts as contactor 11. In addition, "input" 34 and "output" 35 on the output contactors are labeled according to convention and do not necessarily note directions of current flow into or out of the output contactors.

In an example operation, switches within the contactors are controlled—for example controlled to open or to close—to provide force-high to terminal 24 (e.g., a collector) and to provide force-low to terminal 25 (e.g., an emitter).

To provide force-high to terminal 24, switches in input contactors 30 are controlled—for example closed—so that current paths are created between contacts ① and ② and between contacts ⑤ and ⑥. Switches in output contactor 11 are controlled—for example closed—so that current paths are created between contacts ① and ② and between contacts ⑤ and ⑥. Switches within contactors 30 are controlled—for example opened—to prevent current flow to or from contacts ③ and ④ and to or from ⑦ and ⑧. Switches within output contactor 11 are controlled—for example opened—to prevent current flow to or from contacts ③, ④, ⑦, and ⑧.

To provide force-low to terminal 25, switches in input contactors 31 are controlled—for example closed—so that current paths are created between contacts ③ and ④ and between contacts ⑦ and ⑧. Switches in output contactor 14 are controlled—for example closed—so that current paths are created between contacts ③ and ④ and between contacts ⑦ and ⑧. Switches within contactors 31 are controlled—for example opened—to prevent current flow to or from contacts ① and ② and to or from ⑤ and ⑥. Switches within contactor 14 are controlled—for example opened—to prevent current flow to or from contacts ①, ②, ⑤, and ⑥.

In a different example operation, switches within the contactors are controlled—for example controlled to open or to close—to provide force-high to terminal 25 (e.g., an emitter) and to provide force-low to terminal 24 (e.g., a collector). This reverses the polarity of the output terminals 24 and 25, and thus reverses the current direction, relative to the configuration described in the preceding paragraphs.

To provide force-high to terminal 25, switches in input contactors 31 are controlled—for example closed—so that current paths are created between contacts ① and ② and between contacts ⑤ and ⑥. Switches in output contactor 14 are controlled—for example closed—so that current paths are created between contacts ① and ② and between contacts ⑤ and ⑥. Switches within contactors 31 are controlled—for example opened—to prevent current flow to or from contacts ③ and ④ and to or from ⑦ and ⑧. Switches within output contactor 14 are controlled—for example opened—to prevent current flow to or from contacts ③, ④, ⑦, and ⑧.

To provide force-low to terminal 24, switches in input contactors 30 are controlled—for example closed—so that current paths are created between contacts ③ and ④ and between contacts ⑦ and ⑧. Switches in output contactor 11 are controlled—for example closed—so that current paths are created between contacts ③ and ④ and between contacts ⑦ and ⑧. Switches within contactors 30 are controlled—for example opened—to prevent current flow to or from contacts ① and ② and to or from ⑤ and ⑥. Switches within contactor 11 are controlled—for example opened—to prevent current flow to or from contacts ①, ②, ⑤, and ⑥.

The preceding paragraphs describe examples of how current flow through polarity inverter 10 can be reversed by controlling operation of the contactor switches. To reduce the overall inductance of the polarity inverter, the contacts and associated switches within the contactors are interleaved as described previously. Also, electrical connections to the input terminals and the output terminals of the polarity inverter may be implemented using parallel conductive plates separated by an insulator.

Figure 2:
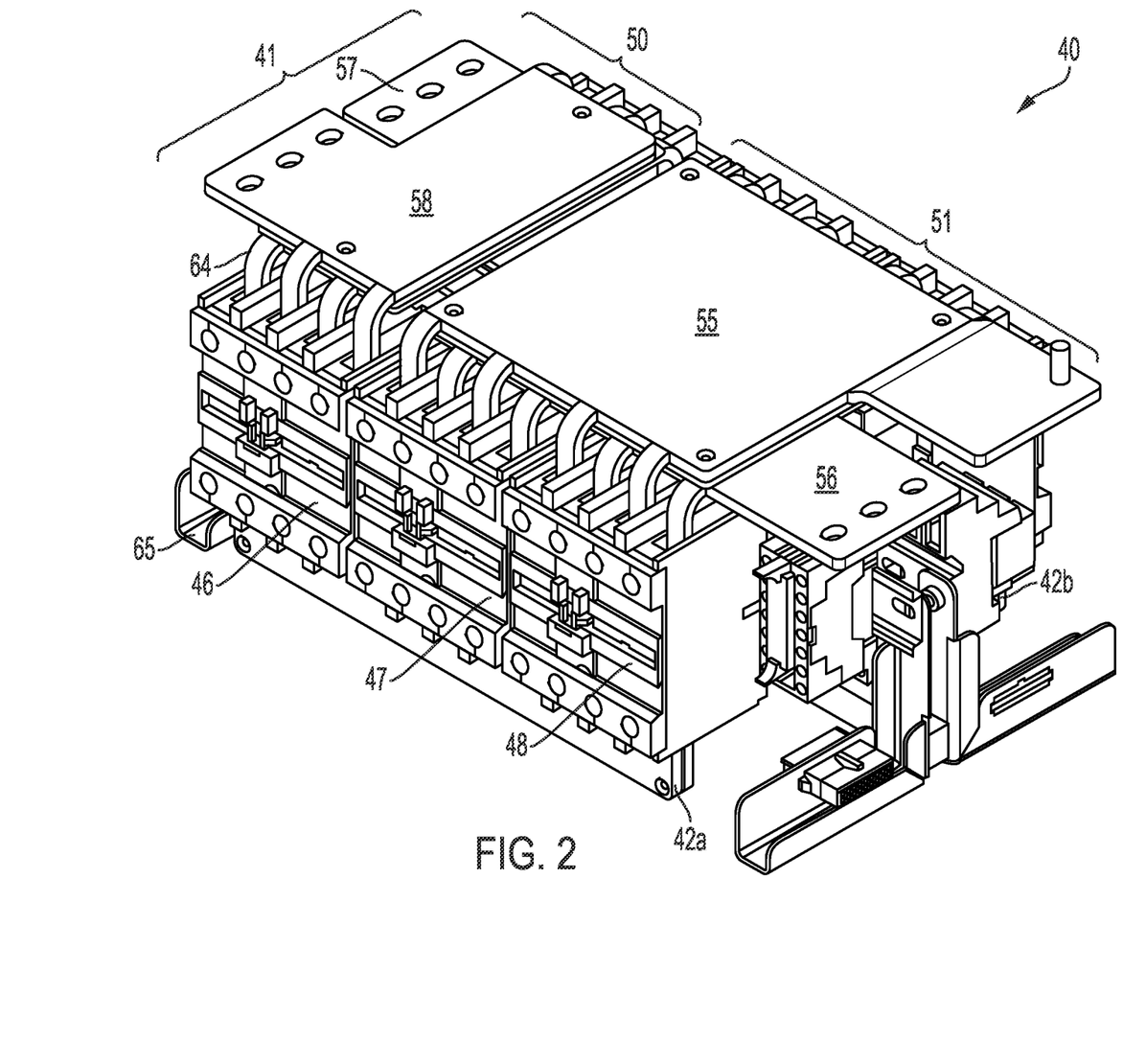
FIG. 2 is a diagram showing a right perspective view of an example polarity inverter configured for reductions in inductance.
Figure 3:
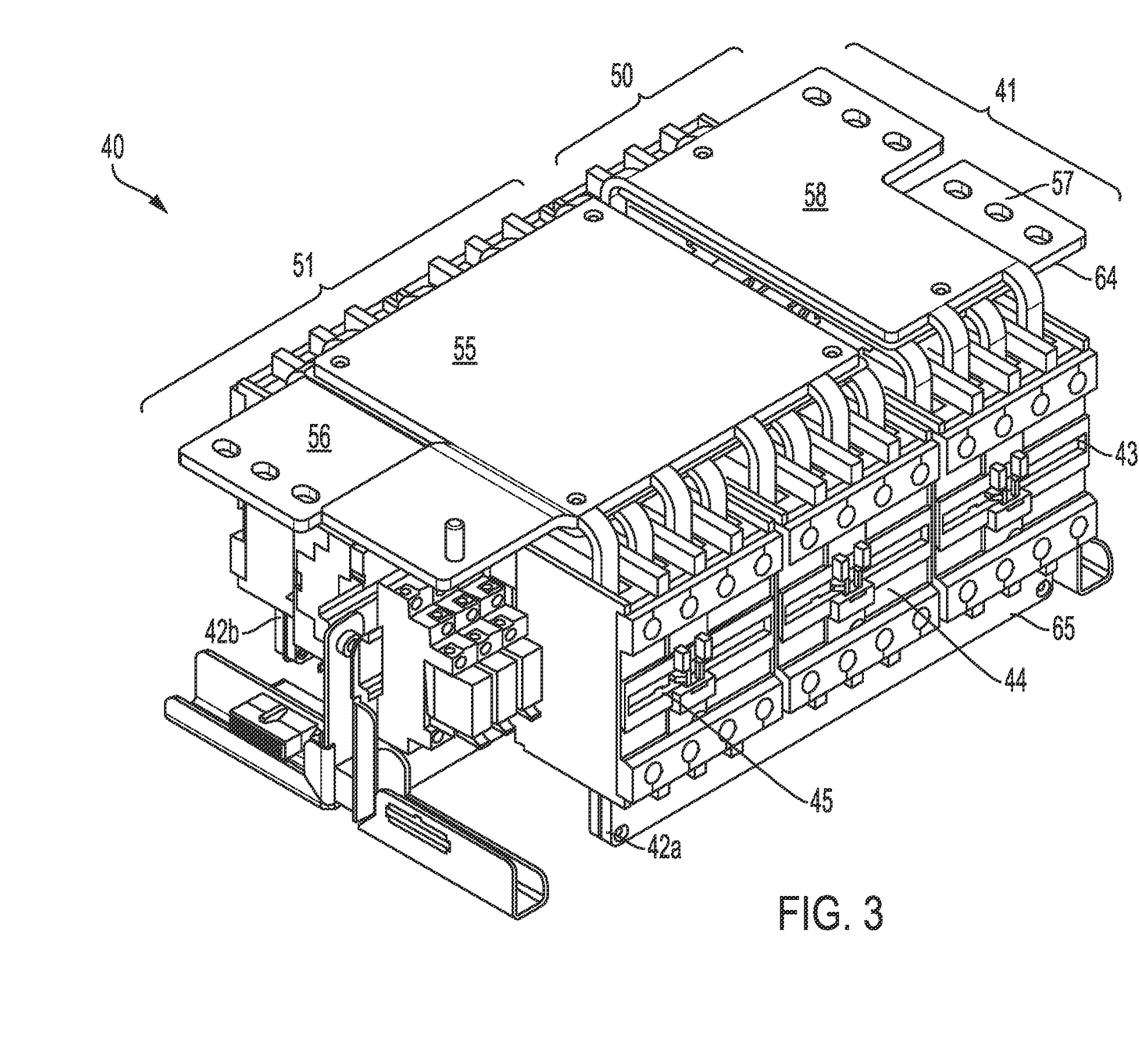
FIG. 3 is a left perspective view of the example polarity inverter of FIG. 2.
Figure 4:
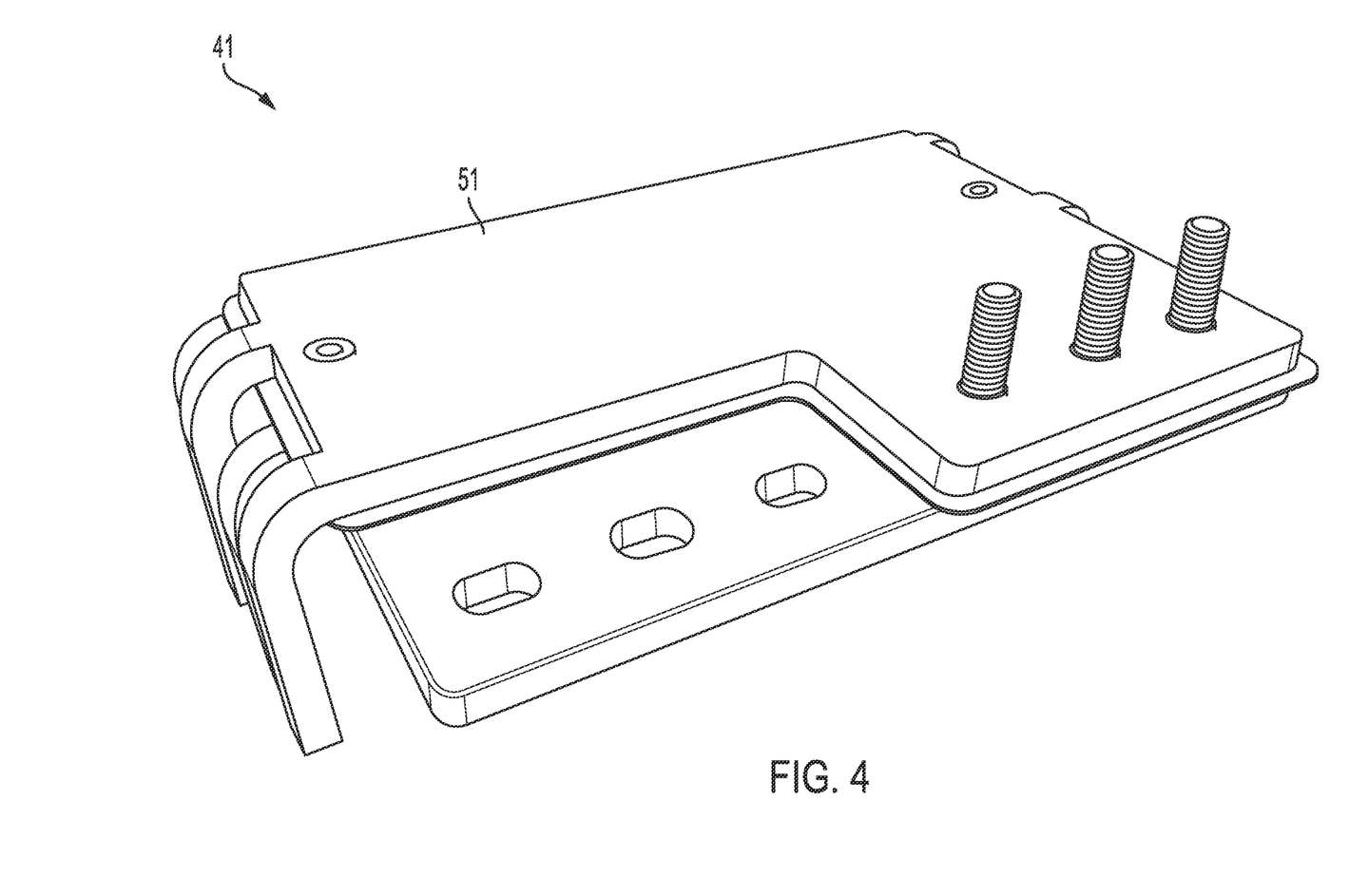
FIG. 4 is a perspective view of example conductive parallel plates that are attachable to the polarity inverters described herein.
Figure 5:
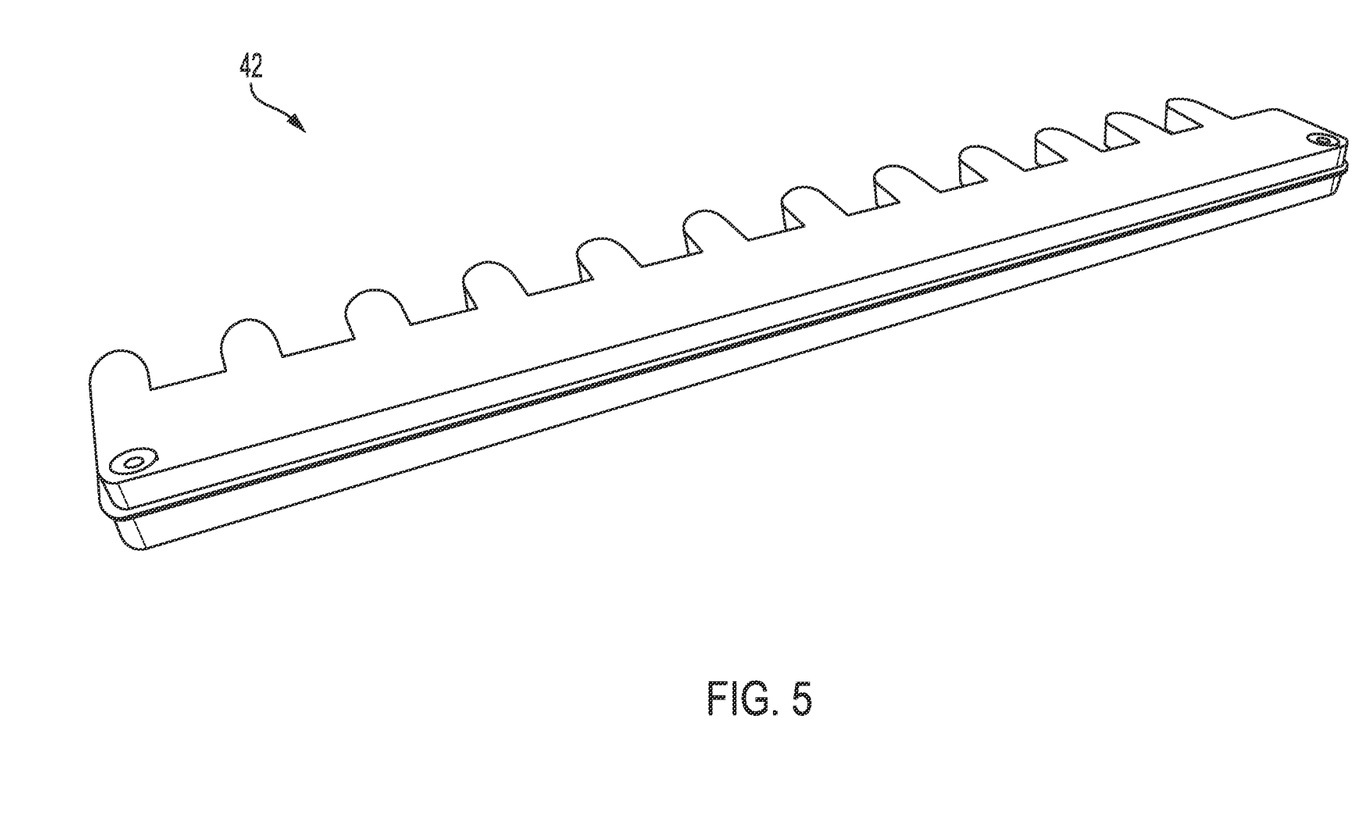
FIG. 5 is a perspective view of example conductive parallel bus bars that are attachable to the polarity inverters described herein.

Electrical Connections of the various input contacts, such as contacts ①, ③, ⑤, and ⑦, to force-high voltage/current and force-low voltage/current may be implemented using parallel conductive plates that are separated by a dielectric material so that the conductive plates do not touch and create a current path. Electrical connections of the various output contacts, such as contacts ②, ④, ⑥, and ⑧, may be implemented using parallel conductive bus bars that are separated by a dielectric material so that the conductive bus bars do not touch and create a current path. FIGS. 2 and 3 shows an example implementation of a polarity inverter 40 containing contactors described with respect to FIG. 1 and also the conductive plates and conductive bus bars described herein. FIG. 4 shows a perspective view of a pair of conductive plates 41 that may be used with polarity inverter 40 and FIG. 5 shows a perspective view of a pair of conductive bus bars 42 that may be used with polarity inverter 40.

In the example polarity inverter 40, contactors 43 to 48 may have the same structure and function as respective contactors 11 to 16 of FIG. 1. In polarity inverter 40, there are two sets of conductive plates 50 and 51. The first set of conductive plates 51 is electrically connected to input terminals such as terminals 20 and 21 of FIG. 1 and the second set of conductive plates 50 is electrically connected to output terminals such as terminal 24 and 25 of FIG. 1. Conductive plates 51 are in a current path that includes a current source, such as that shown in FIG. 6. Conductive plates 50 are in a current path to an output device such a DIB of a test system such as that shown in FIG. 6. Conductive plates 50 and 51 are not directly electrically connected to each, but rather connect electrically through the contactors as described herein.

In this example, conductive plate 55 is connected to a positive polarity or force-high voltage/current and conductive plate 56 is connected to a negative polarity or force-low voltage/current. In this example conductive plate 57 is connected to one output terminal (e.g., the emitter of FIG. 1) and conductive plate 58 is connected to another output terminal (e.g., the collector of FIG. 1). The polarities of the currents and voltages on the conductive plates 55, 56, 57, and 58 are controlled by controlling the switches in the contactors as described with respect to FIG. 1.

The input contacts on contactors 43 to 48 are connected to conductive plates 50 and 51 as shown in FIG. 1. The output contacts on contactors 43 to 48 are connected to conductive bus bars 42a, 42b that are arranged in parallel as shown in FIG. 1 and that are separated by a dielectric material. Referring to FIGS. 1, 2 and 3, there may be one set of parallel bus bars 42a to implement electrical connections 61 on the output side and one set of parallel bus bars 42b to implement electrical connections 60 on the output side. The conductive bus bars and conductive plates may be made of any appropriate electrically-conductive material including, but not limited to, copper or gold. Examples of dielectrics that may be sandwiched between parallel conductive plates and parallel bus bars include, but are not limited to, Formex®, Kapton®, polyimide film, polypropylene, or a combination thereof. In another example, the dielectric is mylar tape having a thickness of 10 mils (0.254 mm).

In the examples of FIGS. 2 and 3, polarity inverter 40 includes six contactors 42 to 48. In this example, each contactor includes contacts and, therefore, six contactors have 24 contacts on their collective top 64 and 24 contacts on their collective bottom 65. For a given contactor such as contactor 43, two points of contact are force-high voltage/current and the remaining two points of contact are force-low voltage/current. The conductive plates are made using parallel copper plates. The conductive plates 51 for the input contactors 44, 45, 47, and 48 are configured such that two fingers from top copper plate 55 are alternatively terminated into four contacts at force-high voltage/current, force-low voltage/current, force-high voltage/current and force-low voltage/current, and such that two fingers from bottom copper plate 56 are alternatively terminated into four contacts at force-high voltage/current, force-low voltage/current, force-high voltage/current and force-low voltage/current. The conductive plates 50 for the output contactors 43 and 46 are configured such that two non-adjacent fingers of top copper plate 58 are terminated into two contacts at force-high voltage/current and two non-adjacent fingers of bottom copper plate 57 are terminated into two contacts at force-low voltage/current. This configuration may reduce inductance by increasing the number of parallel current paths through the polarity inverter. The output contacts of each contactor are connected via parallel bus bars in the manner shown in FIG. 1.

Reducing the spacing between the conductive plates may reduce the inductance associated with the plates and thereby reduce the inductance of the overall polarity inverter. For example, a thickness of the dielectric material between any two parallel conductive plates may be on the order of tenths of a millimeter (mm), such as 0.1 mm, 0.2 mm, 0.3 mm, 0.4 mm. 0.5 mm, 0.6 mm, 0.7 mm, 0.8 mm, or 0.9 mm. In some implementations, the thickness of the dielectric material between any two parallel conductive plates may be 0.5 mm or less. Similarly, reducing the spacing between the parallel bus bars may reduce the inductance associated with the parallel bus bars and thereby reduce the overall inductance of the polarity inverter. For example, a thickness of the dielectric material between any two parallel bus bars may be on the order of tenths of a millimeter (mm), such as 0.1 mm, 0.2 mm, 0.3 mm, 0.4 mm. 0.5 mm, 0.6 mm, 0.7 mm, 0.8 mm, or 0.9 mm. In some implementations, the thickness of the dielectric material between the parallel bus bars may be 0.5 mm or less.

In some implementations, the combination of features described herein, such as the bus bars and spacing therebetween, the conductive plates and spacing therebetween, and the interleaved contacts and switches, enables the polarity inverter to have an inductance that is less than 200 nanohenries (nH) or that is less than 100 nH. That being said, one or more of the features described herein may enable the polarity inverter or any appropriate electronic device containing those features to reduce its inductance to these levels or to levels that are higher or lower than these levels.

The polarity inverter described herein may be part of a test system that includes automatic test equipment ATE 70. For example, as shown in FIG. 6, an example test system may include a current source 71, a polarity inverter 72 of the type described herein (e.g. polarity inverter 10 of FIG. 1 or polarity inverter 40 of FIGS. 2 and 3), an interposer 73, and a DIB 74. Current flows from the current source through the polarity inverter 72, where its polarity is either kept the same or changed as described herein. Current output from the polarity inverter is passed to interposer 73, which is an electrical and/or mechanical interface to DIB 74. The DIB, as noted, holds DUTs in sites 75 for testing and distributes the current from the interposer to the DUTs for testing.

ATE 70 also includes a control system 76. The control system may include a computing system comprised of one or more microprocessors or other appropriate processing devices as described herein. Communication between the control system and the other components of ATE 70 is represented conceptually by line 77. DIB 74 includes a printed circuit board (PCB) that includes mechanical and electrical interfaces to one or more DUTs that are being tested or are to be tested by the ATE. Power, including voltage, may be run via one or more layers in the DIB to DUTs connected to the DIB. DIB 74 also may include one or more ground layers and one or signal layers with connected vias for transmitting signals to the DUTs.

The DIB includes sites 75, which may include pins, conductive traces, or other points of electrical and mechanical connection to which the DUTs may connect. Test signals and response signals, including high current signals pass via test channels over the sites between the DUTs and test instruments. DIB 74 may also include, among other things, connectors, conductive traces, conductive layers, and circuitry for routing signals between test instruments, DUTs connected to sites 75, and other circuitry.

Control system 76 communicates with test instruments (not shown) to control testing. Control system 76 may also configure the switches within polarity inverter 72 to provide voltage/current at the polarity required for testing. The control may be adaptive in that the polarity may be changed during testing if desired or required.

All or part of the test systems described in this specification and their various modifications may be configured or controlled at least in part by one or more computers such as control system 76 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A polarity inverter comprising:
   multiple contactors, each of the multiple contactors comprising switches that are controllable to configure a current path, each of the multiple contactors comprising contacts, the contacts being interleaved such that first contacts to receive voltage having a first polarity alternate with second contacts to receive voltage having a second polarity, the first polarity and the second polarity being different;
   a first conductive plate to connect electrically to each of the first contacts;
   a second conductive plate to connect electrically to each of the second contacts, the first conductive plate and the second conductive plate being in parallel; and
   a dielectric material between the first conductive plate and the second conductive plate.

2. The polarity inverter of claim 1, wherein a number of the contactors corresponds to an amount of current to pass through the polarity inverter and is a based on specifications for a type of contactor used.

3. The polarity inverter of claim 1, wherein the contacts comprise input contacts;
   wherein each of the multiple contactors comprises output contacts on different sides of the switches than the input contacts, the output contacts being interleaved such that third contacts on a current path with the first contacts alternate with fourth contacts on a current path with the second contacts; and
   wherein the polarity inverter comprises:
      a first bus bar to connect electrically to each of the third contacts;
      a second bus bar to connect electrically to each of the fourth contacts, the first bus bar and the second bus bar being in parallel; and
      a dielectric material between the first bus bar and the second bus bar.

4. The polarity inverter of claim 1, wherein the switches are controllable to configure current to flow in a first direction or in a second direction through the multiple contactors, the first direction being opposite to the second direction.

5. The polarity inverter of claim 1, wherein the each of the first conductive plate and the second conductive plate comprises conductive fingers to connect to respective ones of the contacts.

6. The polarity inverter of claim 1, wherein the multiple contactors comprise at least two input contactors and at least two output contactors, the at least two input contactors being configured to receive current from a current source and the at least two output contactors being configured to output current on a path to a device interface board.

7. The polarity inverter of claim 1, wherein the dielectric material comprises a polyimide film.

8. The polarity inverter of claim 1, wherein the dielectric material comprises polypropylene.

9. The polarity inverter of claim 1, wherein spacing between the first conductive plate and the second conductive plate and interleaving of the contacts enables the polarity inverter to have an inductance that is less than 200 nanohenries (nH).

10. The polarity inverter of claim 1, wherein spacing between the first conductive plate and the second conductive plate and interleaving of the contacts enables the polarity inverter to have an inductance that is 100 nanohenries (nH) or less.

11. The polarity inverter of claim 1, wherein a thickness of the dielectric material between the first conductive plate and the second conductive plate is on the order of tenths of a millimeter.

12. The polarity inverter of claim 1, wherein a thickness of the dielectric material between the first conductive plate and the second conductive plate is 0.5 millimeters (mm) or less.

13. The polarity inverter of claim 3, wherein a thickness of the dielectric material between the first bus bar and the second bus bar is on the order of tenths of a millimeter.

14. The polarity inverter of claim 3, wherein a thickness of the dielectric material between the first bus bar and the second bus bar is 0.5 millimeters (mm) or less.

15. The polarity inverter of claim 1, wherein the contactors comprise input contactors and output contactors, the input contactors comprising the first conductive plate and the second conductive plate connected, respectively to a first voltage and to a second voltage; and wherein the polarity inverter comprises output contactors comprising contacts that are interleaved such that third contacts that receive voltage having the first polarity alternate with fourth contacts that receive voltage having the second polarity; and wherein the polarity inverter comprises:
    a third conductive plate to connect electrically to each of the third contacts;
    a fourth conductive plate to connect electrically to each of the fourth contacts, the third conductive plate and the fourth conductive plate being in parallel.

16. The polarity inverter of claim 1, wherein the first polarity is a positive voltage with respect to the second polarity.

17. The polarity inverter of claim 1, wherein the first polarity is a force-high voltage and the second polarity is a force-low voltage, where the force-high voltage is greater than the force-low voltage.

18. A test system comprising:
    a device interface board (DIB) to connect to devices under test (DUTs);
    an interposer to connect to the DIB;
    a current source; and
    a polarity inverter to receive current from the current source and to control a directional flow of the current relative to the interposer; the polarity inverter comprising:
        multiple contactors, each of the multiple contactors comprising switches that are controllable to configure a current path, each of the multiple contactors comprising contacts, the contacts being interleaved such that first contacts to receive voltage having a first polarity alternate with second contacts to receive voltage having a second polarity, the first polarity and the second polarity being different;
        a first conductive plate to connect electrically to each of the first contacts;
        a second conductive plate to connect electrically to each of the second contacts, the first conductive plate and the second conductive plate being in parallel; and
        a dielectric material between the first conductive plate and the second conductive plate.

19. The polarity inverter of claim 18, wherein the switches are controllable to configure current to flow in a first direction or a second direction through the multiple contactors, the first direction being reverse to the second direction.

20. The polarity inverter of claim 18, wherein the polarity inverter comprises at least two input contactors and at least two output contactors, the at least two input contactors being configured to receive the current from the current source and the at least two output contactors being configured to output the current to the interposer.

* * * * *